US007646214B2

(12) United States Patent
Smith

(10) Patent No.: US 7,646,214 B2
(45) Date of Patent: Jan. 12, 2010

(54) POWER HARVESTING SIGNAL LINE TERMINATION

(75) Inventor: Joshua R. Smith, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 11/946,691

(22) Filed: Nov. 28, 2007

(65) Prior Publication Data

US 2009/0134952 A1    May 28, 2009

(51) Int. Cl.
*H03K 17/16* (2006.01)
*H03K 19/003* (2006.01)
(52) U.S. Cl. .............................. 326/30; 326/32; 326/33
(58) Field of Classification Search .................. 326/30, 326/33; 307/149; 327/104
See application file for complete search history.

(56) References Cited

U.S. PATENT DOCUMENTS

| 5,467,044 A * | 11/1995 | Ashe et al. .................. 327/333 |
| 2005/0052283 A1* | 3/2005 | Collins et al. ............ 340/572.7 |
| 2008/0143192 A1* | 6/2008 | Sample et al. .............. 307/149 |

* cited by examiner

*Primary Examiner*—Anh Q Tran
(74) *Attorney, Agent, or Firm*—Schwegman, Lundberg & Woessner, P.A.; Gregory J. Gorrie

(57) ABSTRACT

In various embodiments of the invention, a power-harvesting termination circuit may be used to 1) match the impedance of a signal line being terminated, and 2) recover a portion of electrical power from a signal on the signal line and provide the recovered power as an electrical voltage to be used to power other circuits. The power may be harvested at either the receiving device or at the transmitting device.

15 Claims, 9 Drawing Sheets

DATA OUT

DATA IN

POWER HARVESTING SIGNAL LINE TERMINATION

BACKGROUND

Signal lines generally require a termination circuit at the end of the line to reduce or prevent signal reflections caused by impedance mismatch between the line itself and the input circuit that receives the signal. The conventional way to do this is to terminate the line with a resistor whose resistance matches the line impedance. In this technique, most of the energy from the signal ends up being dissipated as heat in the resistor. In today's circuits, with a premium being placed on power savings and thermal management, the energy lost in these termination resistors can result in unwanted heat being generated in the circuit, and can increase power consumption.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" indicates that two or more elements are in direct physical or electrical contact with each other. "Coupled" indicates that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

In some embodiments of the invention, a special line termination circuit may be used to harvest electrical power from the signal being received over the line. This harvested power may be provided to the device to help power other circuitry, thereby reducing the total power consumption of the device. For example, the harvested electrical power might be used to help power the interface circuitry and/or the data encoding/decoding circuitry, although this should not be seen as a limitation on the embodiments of the invention unless so specified.

Figure 1:
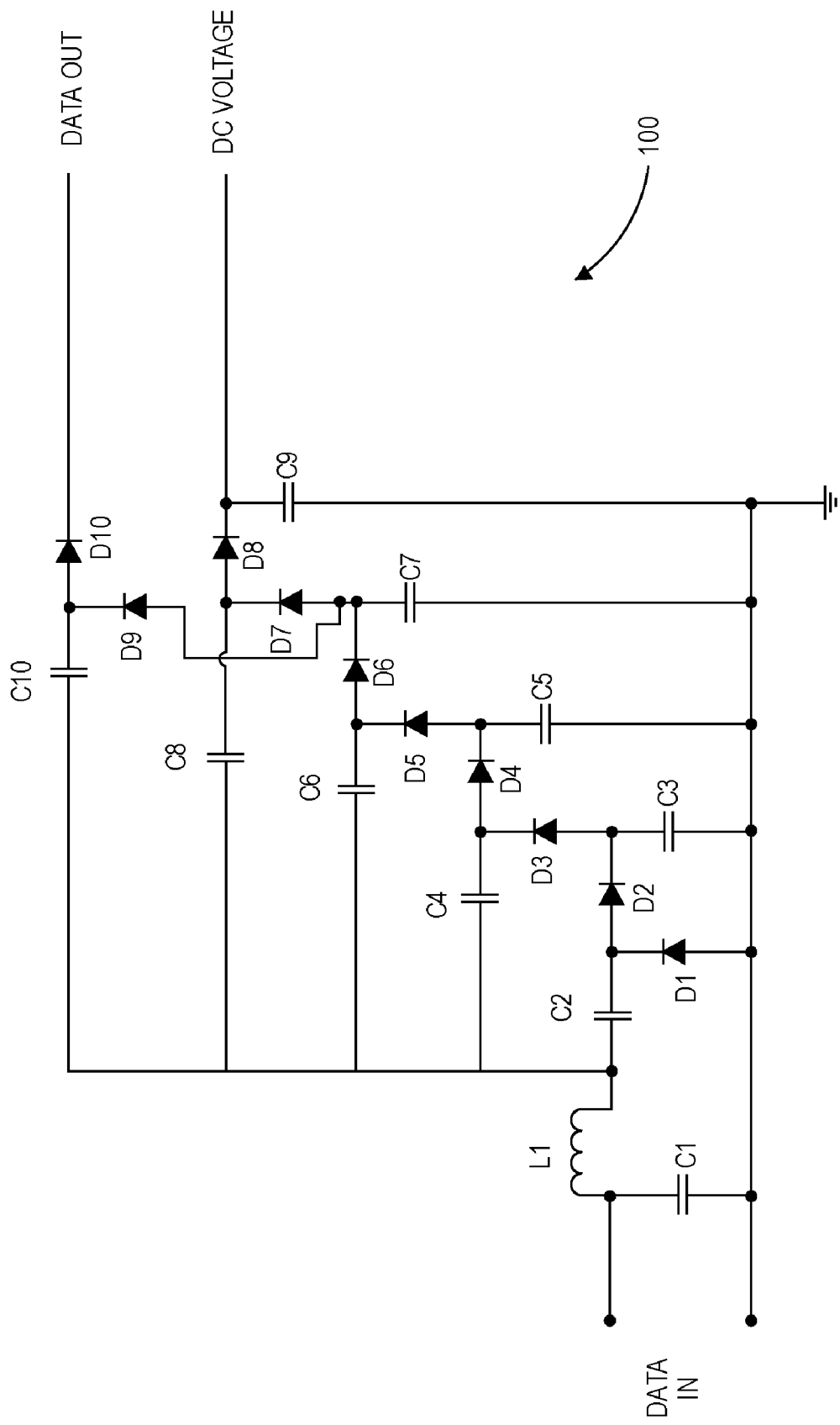
FIG. 1 shows a power-harvesting termination circuit, according to an embodiment of the invention.

FIG. 1 shows a power-harvesting termination circuit, according to an embodiment of the invention. Other suitable circuits may also be used to accomplish the same results. In the illustrated circuit 100, an impedance-matching portion may comprise inductor L1 and capacitor C1, which may be sized to match the impedance of the signal line that is being terminated. Since this termination uses reactive components (i.e., capacitive and/or inductive components) rather than a resistive component, it may not dissipate the heat that a simple resistor would. Note: Within the context of this document, a reactive 'component' does not have to be a separately identifiable physical component or circuit, but may be created through distributed inductances and capacitances through such things as transmission line geometry, stubs, etc. The example shows an input signal voltage at DATA IN with a ground-based signal reference input, but other embodiments may use other techniques. For example, the ground reference may be replaced with a non-ground constant voltage level, and/or other circuitry (not shown) may be used to convert the signal level. The signal that goes thru L1 may also pass thru C10 and diode D10 to produce the data signal at DATA OUT.

At the same time, a power harvesting portion of the circuit may be used to collect electrical energy from the incoming signal, and provide that electrical energy at DC VOLTAGE in the form of a voltage level that may be used to power other circuitry (not shown). In the illustrated embodiment, the power harvesting circuit may comprise diodes D1-D8 and capacitors C2-C9, but other embodiments may use other circuitry. The example shown comprises a four-stage voltage rectifier, with the outputs of the four stages being at the D2-C3 node, the D4-C5 node, the D6-C7 node, and the D8-C9 node, respectively. In a manner that is known in the field of voltage multipliers, by providing a variable signal at the L1-C2 node, the output of each stage may produce a voltage that has a DC component that is greater than the DC component at the input of the stage. Thus each successive stage may produce a successively higher DC voltage. The number of stages may be chosen to produce the desired output voltage, with the desired output current capacity, at DC VOLTAGE. In most applications in which DATA IN is a data signal from a hard-wired line, the output voltage at DC VOLTAGE may not need to be significantly higher than the signal voltage at DATA IN, and fewer stages may be used than are shown in FIG. 1 (possibly as few as one stage). In such cases, voltage rectification may be more important than voltage multiplication. Hence, the circuit is referred to herein as a voltage rectifier circuit rather than a voltage multiplier circuit, even though both advantages may be produced the circuit.

To produce the proper signal at DATA OUT, capacitor C10 may pass the AC component of the data signal, diode D9 may be used to prevent capacitor C7 from distorting that data signal, and diode D10 may be used to prevent to the load of the following circuit from unnecessarily draining capacitor C10 or C7. Capacitor C10 may have a relatively low time constant so that the data signal will pass through without excessive distortion, while capacitor C9 may have a relatively high time constant to store sufficient electrical charge to power a following device, and to filter out much of the AC component that comes through D8.

Figure 2B:
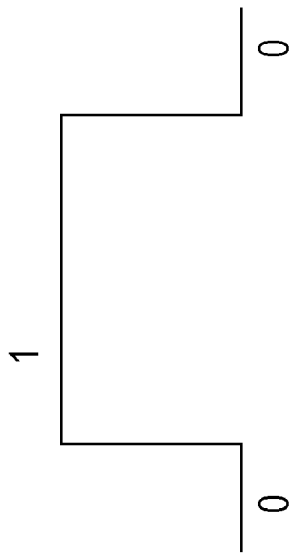
FIGS. 2A-2C show waveform diagrams of signals at the input and outputs of a power-harvesting termination circuit, according to an embodiment of the invention.
Figure 2C:
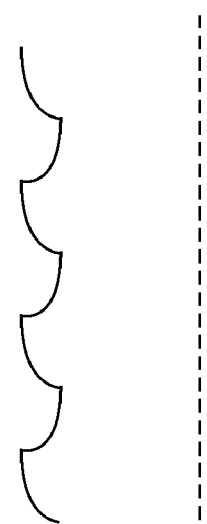
Figure 2A:
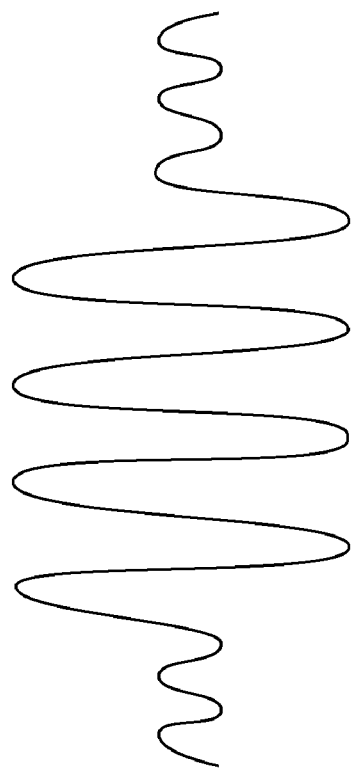

FIGS. 2A-2C show waveform diagrams of signals at the input and outputs of a power-harvesting termination circuit, according to an embodiment of the invention. The illustrated example shows an amplitude-modulated carrier wave at 2A, that has been modulated to encode a 0-1-0 sequence. After being received at DATA IN and passing through the circuit of FIG. 1, the signal at DATA OUT may look like the binary signal at 2B. The voltage at DC VOLTAGE may look like the signal at 2C, which is shown as a relatively steady-state DC voltage with a small amount of ripple. Note: for clarity of illustration, the examples of FIGS. 2A-2C are not drawn to scale. For example, only a few carrier wave cycles are shown in FIG. 2a to encode the '1' bit, while the ripple in FIG. 2C may show exaggerated amplitude. These should not be interpreted as limitations on the signal waveforms that would be experienced in an actual circuit.

Although not shown, some embodiments may be designed to receive the binary waveform itself at the input, without a carrier wave (similar to the waveform shown in FIG. 2B). In such embodiments, the capacitors would be sized for the less-frequently changing voltage level (as compared to a carrier wave). Further, the binary waveform would need to change between the '1' and '0' levels frequently enough to let the voltage rectifier circuit operate efficiently. Various encoding schemes exist that may assure a signal change at least once for each encoded bit.

Figure 3:
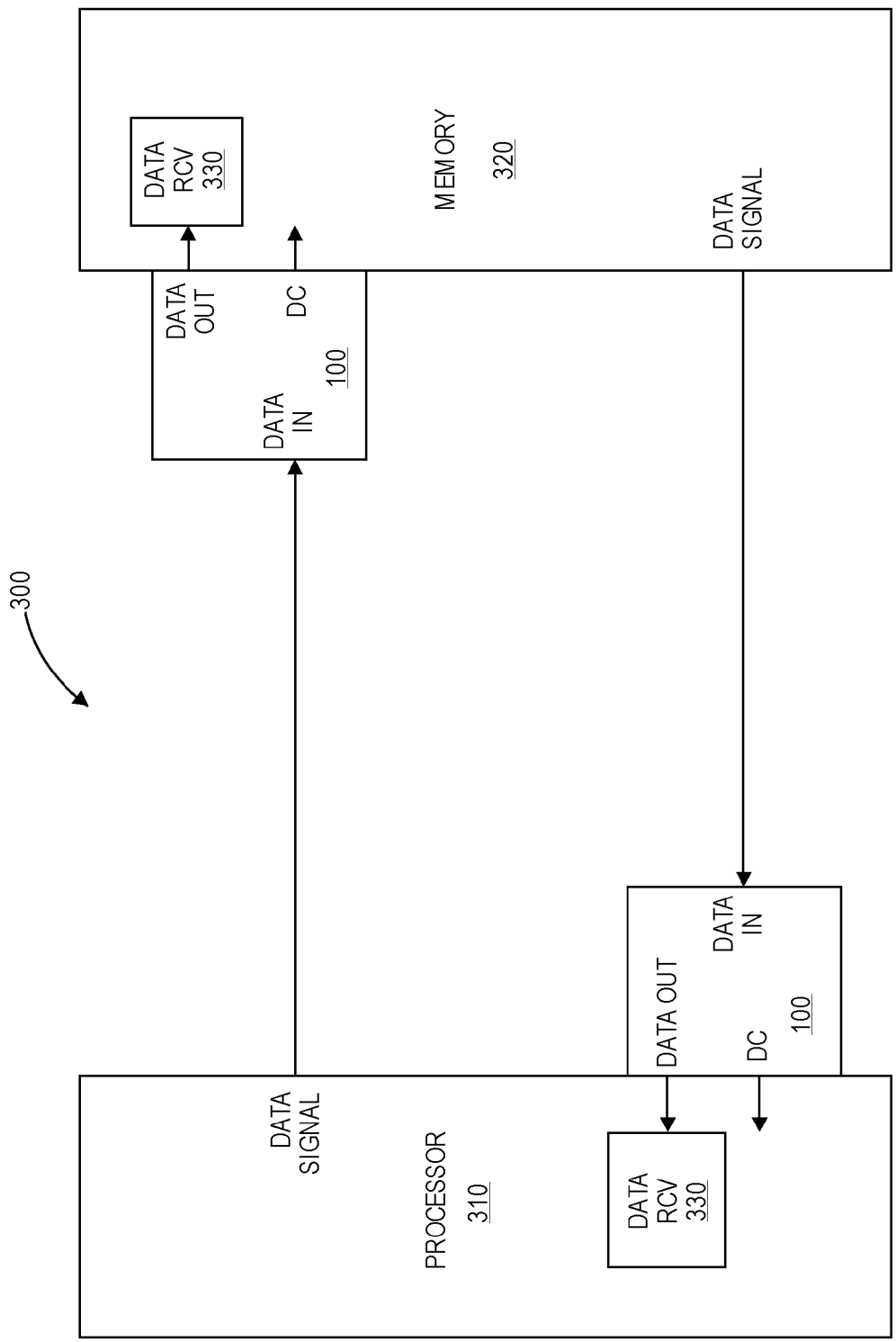
FIG. 3 shows a system using power-harvesting termination circuits, according to an embodiment of the invention.

FIG. 3 shows a system using power-harvesting termination circuits, according to an embodiment of the invention. In the illustrated system 300, a processor 310 transmits data to a memory 320, and the memory 320 transmits data to the processor 310. The processor and memory are used here merely as an example. Other embodiments may transmit data between any other feasible types of devices. For clarity, the example only shows one power-harvesting circuit at each device, but a separate power-harvesting circuit may be used for each of multiple signal lines that are received by each device. The example also shows only two devices in a point-to-point communications, but embodiments of the invention may also be used in a shared-bus configuration.

Figure 4:
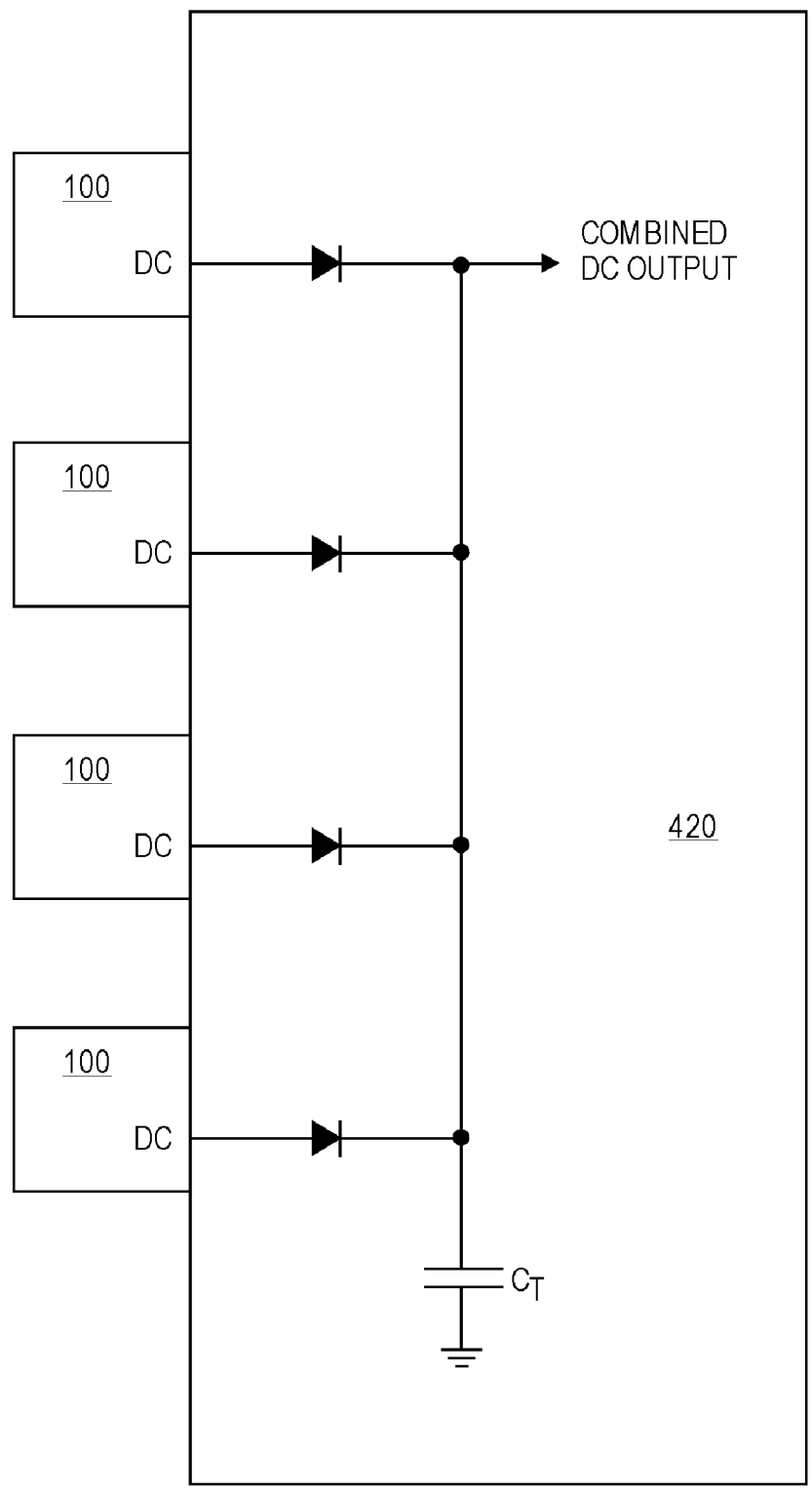
FIG. 4 shows a circuit to combine the power harvested from multiple power-harvesting circuits, according to an embodiment of the invention.

In the illustrated system 300, a power-harvesting circuit 100 may terminate each signal line, with the DATA IN input, DATA OUT output, and DC output representing the DATA IN, DATA OUT, and DC VOLTAGE of the circuit in FIG. 1. The DATA OUT output may pass the data signal to a data receiving circuit 330. When appropriate, the data receiving circuit 330 may also convert the data signal to another format and/or voltage level. The multiple power-harvesting circuits at each device may operate independently of each other, but in some embodiments the output produced by each one may be combined into a single power source that may be used to power other circuits, as shown in the example of FIG. 4. In the embodiment shown, the outputs are combined in parallel to produce a higher current capacity, but other embodiments may combine the outputs in serial to create a higher voltage. The capacitor CT may collect the power harvested by multiple power-harvesting circuits 100, and provide the charged stored in CT as a Combined DC Voltage to a device from circuit 420. The device may be a processor, memory, I/O circuit, or any other circuit that can benefit from the electrical power provided by the power harvesting circuits. In some embodiments, $C_T$ may represent additional capacitive storage to that provided by the multiple C9 capacitors from the multiple power-harvesting circuits 100. In other embodiments, a single $C_T$ may replace all of the individual C9 capacitors.

Figure 5:
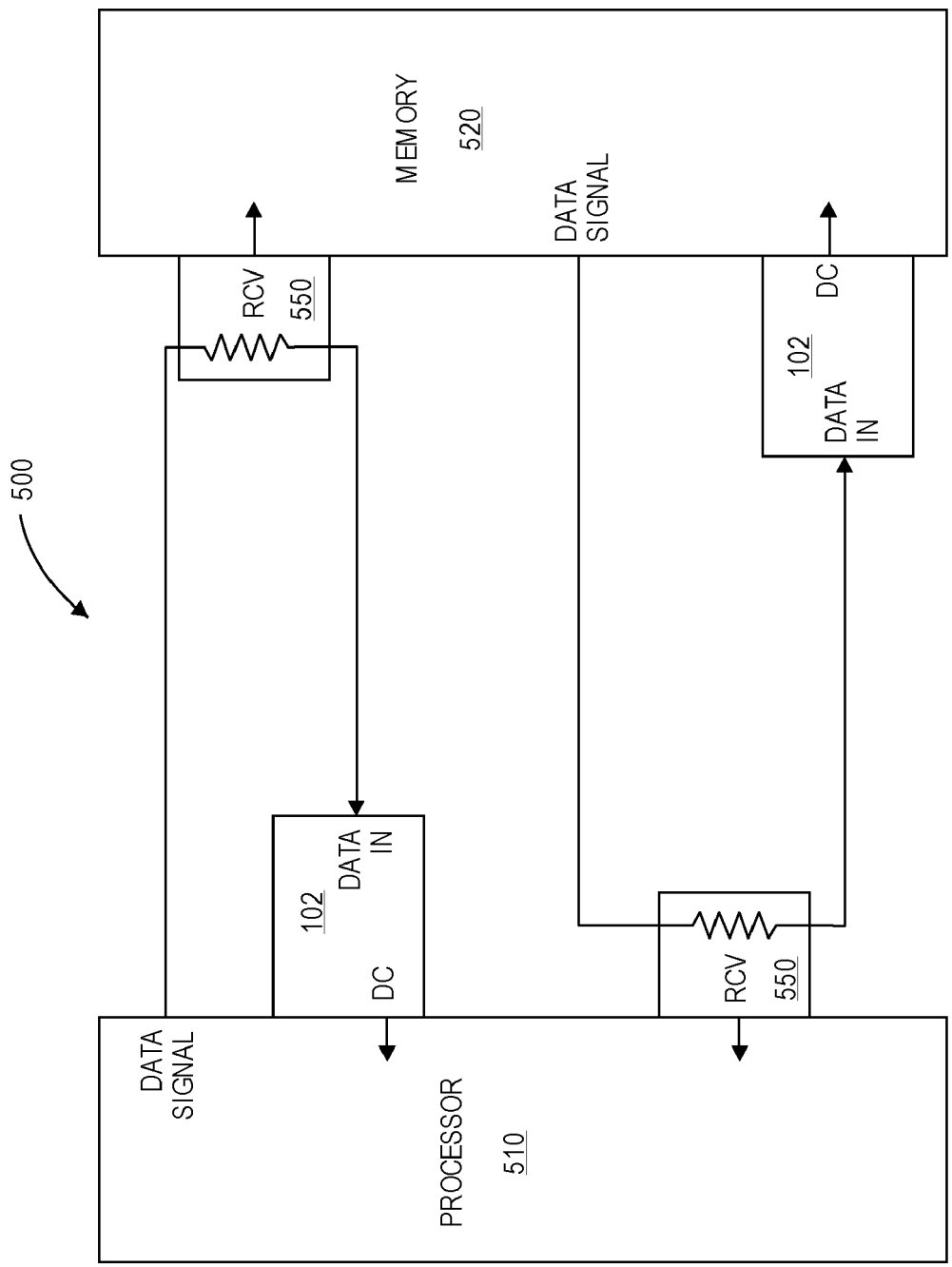
FIG. 5 shows another system using power-harvesting termination circuits, according to an embodiment of the invention.

FIG. 5 shows another system using power-harvesting termination circuits, according to an embodiment of the invention. In the illustrated system 500, the power recovered by the power-harvesting circuit may be provided to the device doing the transmitting rather than to the device doing the receiving. (In either case the power-harvesting circuit may be co-located with the device to which it provides power.) A signal transmitted from, for example, processor 510, may go through a receive circuit 550 at memory 520, and be looped back to processor 510. Power harvesting circuit 102 may then recover some of the energy from the signal and provide that energy to processor 510 in the manner previously described. However, since the actual data need not be detected by processor 510, the data portions of the power harvesting circuit (for example, D9, D10 and C10 of FIG. 1) may be eliminated.

The signal received at memory 520 by receive circuit 550 may be captured from the loop by any feasible means, such as by using a resistor to convert current in the loop to a detectable voltage. Other means of capturing the signal may also be used. FIG. 5 also shows data being transmitted from device 520 to device 510, and looped back to device 520 in the manner previously described. As before, multiple circuits 102 and 550 may be used to handle multiple signal lines.

Figure 6:
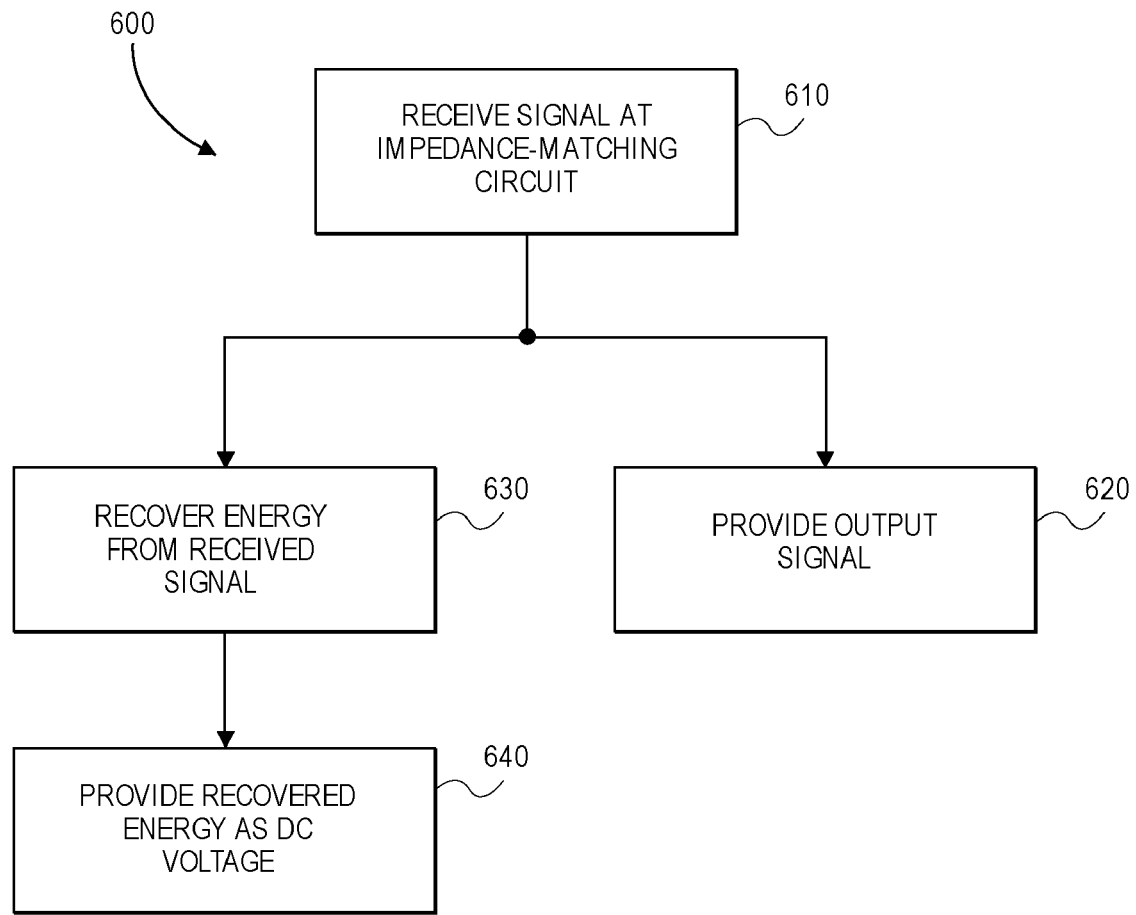
FIG. 6 shows a flow diagram of a method of harvesting electrical power with a power-harvesting termination circuit, according to an embodiment of the invention.

FIG. 6 shows a flow diagram of a method of harvesting electrical power with a power-harvesting termination circuit, according to an embodiment of the invention. In the illustrated flow diagram 600, a signal may be received by an impedance-matching input circuit at 610. At 620, the signal may be provided at a data output. In some embodiments, the form of the output signal may be a replica of the input signal. In other embodiments, the waveform may be modified before presenting it to the output. For example, the baseband signal may be extracted from a modulated carrier wave and presented to the output, while the carrier wave is removed before presentation.

While the input signal is being processed and presented to the output, a power harvesting circuit may recover electrical energy from the received signal at 630. This recovered electrical energy may then be presented to another output as a DC voltage at 640. In some embodiments, the DC voltage may contain a small AC ripple as an artifact of the recovery process, but this should not detract from the usability of the DC voltage.

Figure 7:
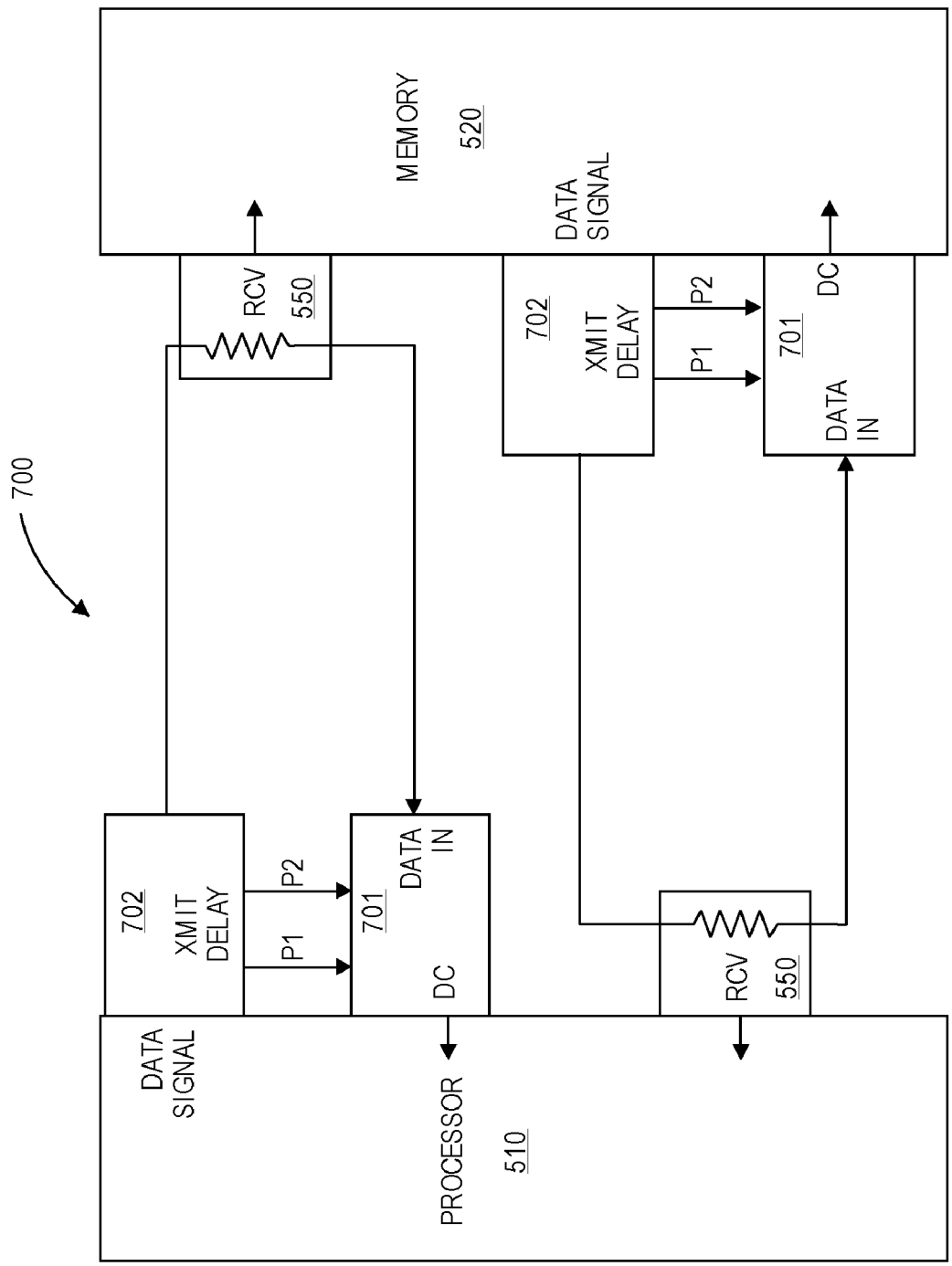
FIG. 7 shows a more efficient version of the system of FIG. 5, according to an embodiment of the invention.

FIG. 7 shows a more efficient version of the system of FIG. 5, according to an embodiment of the invention. In the illustrated system 700, the XMIT DELAY circuit 702 creates a delayed version of the data signal being transmitted from processor 510 to memory 520, and provides that delayed data signal P1 directly to the voltage rectifier in power harvesting circuit 701. P2 is an inverted version of P1. The delay is intended to match the time it takes for the transmitted data signal to make the round trip from a first device to a second device and back to the power harvesting circuit 701 at the first device, so that the timing of the P1, P2 signals closely matches the timing of the data signal received at DATA IN. These delayed signals P1, P2 may then be used to time the switching of the stages of the voltage rectifier circuit within power harvesting circuit 701, with the purpose of improving the efficiency of the voltage rectifier circuit.

Figure 8:
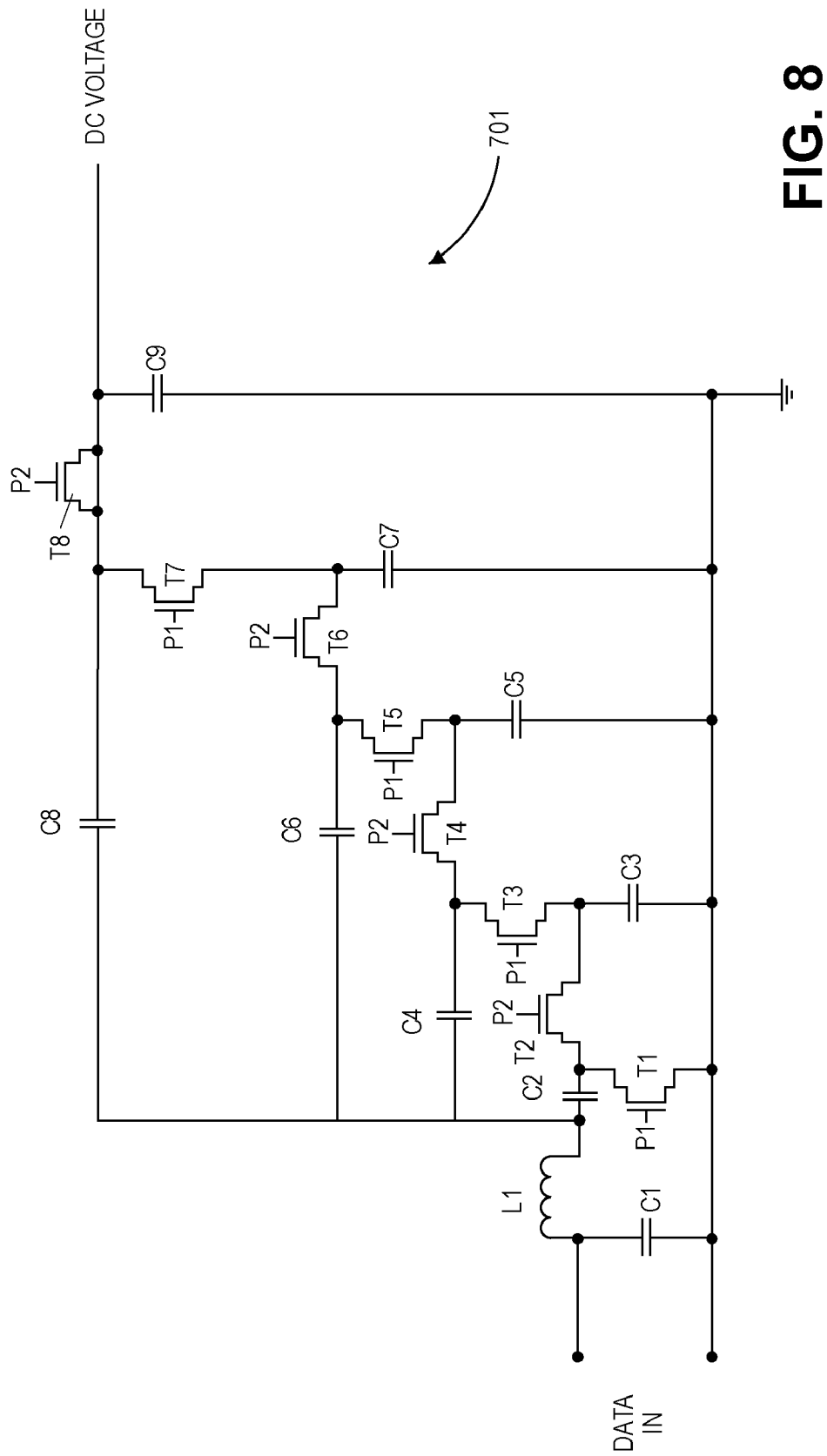
FIG. 8 shows a power harvesting circuit that can use the delayed signals of FIG. 7, according to an embodiment of the invention.

FIG. 8 shows a power harvesting circuit that can use the delayed signals of FIG. 7, according to an embodiment of the invention. The circuit of FIG. 8 is similar to the circuit of FIG. 1, except that each diode D1-D8 in FIG. 1 has been replaced by a transistor T1-T8 in FIG. 8. These transistors are controlled by the signals P1, P2 of FIG. 7. The circuit of FIG. 1 may rely on the data signal reaching a threshold value before switching can take place, and rising/falling edges of the data signal may be delayed and/or distorted after making the round trip through the signal lines. The circuit of FIG. 8 is not so restricted in that respect, but may instead use the original, undistorted signals to time the switching in the power-harvesting circuit. Such functionality may be referred to as synchronous rectification.

Figure 9:
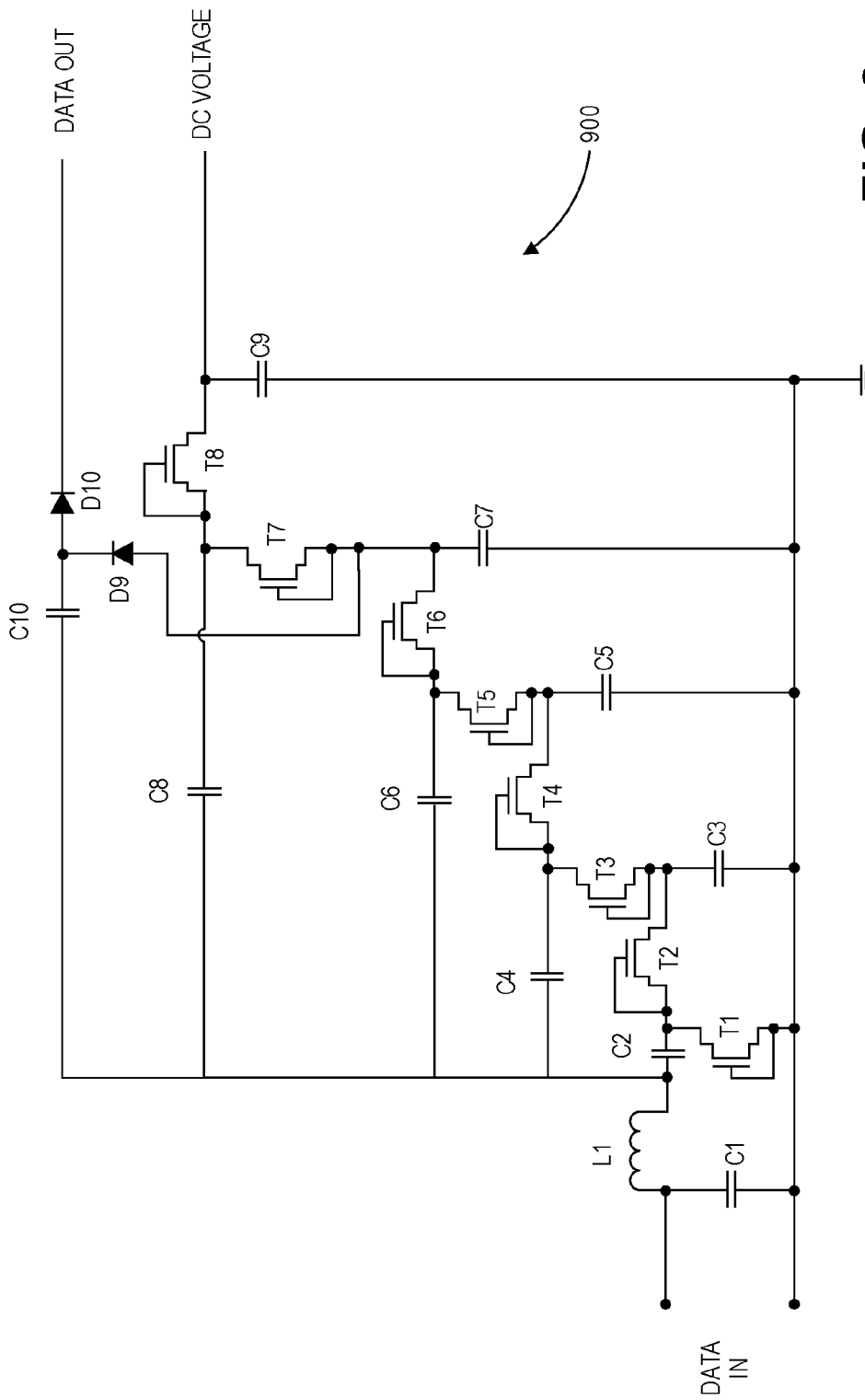
FIG. 9 shows a slightly different version of the circuit of FIG. 1, according to an embodiment of the invention.

FIG. 9 shows a slightly different version of the circuit of FIG. 1, according to an embodiment of the invention. In circuit 900, diode-connected transistors T1-T8 may be used instead of the diodes D1-D8 that are shown in FIG. 1. In some embodiments, diode-connected transistor may also be used instead of diode D9 and/or diode D10.

The foregoing description is intended to be illustrative and not limiting. Variations will occur to those of skill in the art. Those variations are intended to be included in the various embodiments of the invention, which are limited only by the spirit and scope of the following claims.

What is claimed is:

1. A signal line termination configured to terminate a signal line, the signal line termination comprising
    a first circuit having an input to be coupled to the signal line and a first output to be coupled to a device co-located with the first circuit, the first circuit to provide electrical power to the device, the first circuit comprising:
    an impedance-matching portion connected to the input to match an impedance of the signal line, wherein the impedance-matching portion comprises reactive components; and
    a power-harvesting portion coupled between the impedance-matching portion and the first output to convert a portion of energy in a signal on the signal line to DC electrical power to be provided to the device through the first output,
    wherein the impedance-matching portion is configured to reduce reflections on the signal line caused by impedance mismatch, and
    wherein the portion of energy in the signal converted to DC electrical power by the power-harvesting portion corresponds at least to an amount the reflections are reduced by.

2. The signal line termination of claim 1, comprising:
    a second output to provide data to the device; and
    a data portion to provide a data signal from the input to the second output.

3. The signal line termination of claim 1, wherein the power-harvesting portion comprises a voltage rectifier circuit with at least one stage.

4. The signal line termination of claim 1, wherein the voltage rectifier circuit comprises diodes and capacitors.

5. The signal line termination of claim 1, wherein the voltage rectifier circuit comprises diode-connected transistors and capacitors.

6. The signal line termination of claim 1, comprising a second circuit having an impedance matching portion and a power-harvesting portion, the power-harvesting portion of the second circuit coupled to the power-harvesting portion of the first circuit to provide a combined output to the device.

7. A signal line termination configured to terminate a signal line, the signal line termination comprising:
    a first circuit, a second circuit, and at least one capacitor to combine charge from the first circuit with charge from the second circuit,
    wherein the first circuit has an input to be coupled to the signal line and a first output to be coupled to a device co-located with the first circuit, the first circuit to provide electrical power to the device, the first circuit comprising:
    an impedance-matching portion connected to the input to match an impedance of the signal line, wherein the impedance-matching portion comprises reactive components; and
    a power-harvesting portion coupled between the impedance-matching portion and the first output to convert a portion of energy in a signal on the signal line to DC electrical power to be provided to the device through the first output,
    wherein the second circuit comprises an impedance matching portion and a power-harvesting portion, the power-harvesting portion of the second circuit coupled to the power-harvesting portion of the first circuit to provide a combined output to the device.

8. A signal line termination configured to terminate a signal line, the signal line termination comprising:
    a first circuit, a second circuit, and at least one capacitor to combine a voltage from the first circuit in series with a voltage from the second circuit,
    wherein the first circuit has an input to be coupled to the signal line and a first output to be coupled to a device co-located with the first circuit, the first circuit to provide electrical power to the device, the first circuit comprising:
    an impedance-matching portion connected to the input to match an impedance of the signal line, wherein the impedance-matching portion comprises reactive components; and
    a power-harvesting portion coupled between the impedance-matching portion and the first output to convert a portion of energy in a signal on the signal line to DC electrical power to be provided to the device through the first output,
    wherein the second circuit comprises an impedance matching portion and a power-harvesting portion, the power-harvesting portion of the second circuit coupled to the power-harvesting portion of the first circuit to provide a combined output to the device.

9. The signal line termination of claim 1, further comprising the device.

10. A signal line termination configured to terminate a signal line, the signal line termination comprising:
    a first circuit having an input to be coupled to the signal line and a first output to be coupled to a device co-located with the first circuit, the first circuit to provide electrical power to the device, the first circuit comprising:
    an impedance-matching portion connected to the input to match an impedance of the signal line, wherein the impedance-matching portion comprises reactive components; and
    a power-harvesting portion coupled between the impedance-matching portion and the first output to convert a portion of energy in a signal on the signal line to DC electrical power to be provided to the device through the first output, wherein the signal is to originate with another device.

11. The signal line termination of claim 9, wherein the signal is to originate with the device and be received from another device.

12. The signal line termination of claim 11, wherein the first circuit is to receive a delayed version of the signal from the device to operate the first circuit.

13. A method for terminating a signal line with a signal line termination, the method comprising:
   receiving a signal through an impedance-matching circuit;
   providing the signal from the impedance-matching circuit to a signal output;
   recovering a portion of energy from the received signal; and
   providing the recovered portion to a device as a DC voltage,
   wherein the impedance-matching circuit is configured to reduce reflections on the signal line caused by impedance mismatch, and
   wherein the portion of energy in the received signal provided as the DC voltage corresponds to an amount the reflections are reduced by.

14. The method of claim 13, wherein said recovering comprises using a voltage rectifier to convert the portion of energy into the DC voltage.

15. The method of claim 13, further comprising combining recovered energy from multiple signal lines into the DC voltage.

* * * * *